United States Patent
Cheng et al.

(10) Patent No.: US 9,892,975 B2
(45) Date of Patent: Feb. 13, 2018

(54) ADJACENT STRAINED <100> NFET FINS AND <110> PFET FINS

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/373,507

(22) Filed: Dec. 9, 2016

(65) Prior Publication Data
US 2017/0092545 A1 Mar. 30, 2017

Related U.S. Application Data

(63) Continuation of application No. 14/665,022, filed on Mar. 23, 2015, now Pat. No. 9,583,507.

(51) Int. Cl.
*H01L 21/82* (2006.01)
*H01L 27/12* (2006.01)
(Continued)

(52) U.S. Cl.
CPC ......... *H01L 21/823807* (2013.01); *H01L 21/02532* (2013.01); *H01L 21/02609* (2013.01);
(Continued)

(58) Field of Classification Search
CPC ....... H01L 29/04; H01L 29/045; H01L 29/06; H01L 29/064; H01L 29/0649;
(Continued)

(56) References Cited

U.S. PATENT DOCUMENTS 6,610,548 B1    8/2003   Ami et al.
6,852,575 B2    2/2005   Bojarczuk, Jr. et al.
(Continued)

OTHER PUBLICATIONS

IBM: List of IBM Patents or Patent Applications Treated as Related (Appendix P), Dec. 9, 2016, pp. 1-2.
(Continued)

*Primary Examiner* — Monica D Harrison
(74) *Attorney, Agent, or Firm* — Kristofer L. Haggerty

(57) ABSTRACT

The present invention relates generally to semiconductor devices, and more particularly, to a structure and method of forming strained <100> n-channel field effect transistor (NFET) fins and adjacent strained <110> p-channel field effect transistor (PFET) fins on the same substrate. A <110> crystalline oxide layer may be either bonded or epitaxially grown on a substrate layer. A first SOI layer with a <100> crystallographic orientation and tensile strain may be bonded to the crystalline oxide layer. A second SOI layer with a <110> crystallographic orientation and compressive strain may be epitaxially grown on the crystalline oxide layer. The first SOI layer may be used to form the fins of a NFET device. The second SOI layer may be used to form the fins of a PFET device.

12 Claims, 10 Drawing Sheets

(51) Int. Cl.
*H01L 29/16* (2006.01)
*H01L 21/8238* (2006.01)
*H01L 21/84* (2006.01)
*H01L 21/762* (2006.01)
*H01L 21/02* (2006.01)
*H01L 27/092* (2006.01)
*H01L 29/06* (2006.01)
*H01L 29/10* (2006.01)
*H01L 29/04* (2006.01)
*H01L 29/161* (2006.01)

(52) U.S. Cl.
CPC ............ *H01L 21/76251* (2013.01); *H01L 21/823821* (2013.01); *H01L 21/845* (2013.01); *H01L 27/0924* (2013.01); *H01L 27/1211* (2013.01); *H01L 29/045* (2013.01); *H01L 29/0649* (2013.01); *H01L 29/1054* (2013.01); *H01L 29/16* (2013.01); *H01L 29/161* (2013.01)

(58) Field of Classification Search
CPC ... H01L 29/10; H01L 29/105; H01L 29/1054; H01L 29/16; H01L 29/161; H01L 27/09; H01L 27/092; H01L 27/12; H01L 27/121; H01L 27/1211; H01L 21/02; H01L 21/02609; H01L 21/02532; H01L 21/82; H01L 21/823807; H01L 21/823821; H01L 21/84; H01L 21/845

USPC ........................................................ 257/351
See application file for complete search history.

(56) References Cited

U.S. PATENT DOCUMENTS

| 7,135,699 | B1 | 11/2006 | Atanackovic |
| 7,364,989 | B2 | 4/2008 | Tweet et al. |
| 7,393,733 | B2* | 7/2008 | Currie ............. H01L 21/823807 257/E21.633 |
| 7,803,670 | B2 | 9/2010 | White et al. |
| 8,106,381 | B2 | 1/2012 | Atanackovic |
| 8,853,781 | B2 | 10/2014 | Cheng et al. |
| 8,872,172 | B2 | 10/2014 | Cheng et al. |
| 9,583,507 | B2* | 2/2017 | Cheng ............. H01L 21/02381 |

OTHER PUBLICATIONS

Cheng et al., Pending U.S. Appl. No. 14/665,022, filed Mar. 23, 2015, titled "Adjacent Strained <100> NFET Fins and <110> PFET Fins," pp. 1-25.

ip.com, Disclosed Anonymously, "Method for Epitaxial Growth on Si," IP.com No. IPCOM000213575D, Dec. 21, 2011, 5 pages.

Pending DE Application No. 102016003322.3 (Germany), filed on Mar. 21, 2016, titled "Adjacent Strained <100> NFET Fins and <110> PFET Fins," pp. 1-25.

* cited by examiner

US 9,892,975 B2

ADJACENT STRAINED <100> NFET FINS AND <110> PFET FINS

BACKGROUND

The present invention relates generally to semiconductor devices and more particularly, to a structure and method of forming strained <100> n-channel field effect transistor (NFET) fins and adjacent strained <110> p-channel field effect transistor (PFET) fins on the same substrate.

In each new generation of semiconductor technology, transistor current decreases due to gate width reduction, mobility degradation of minority carriers, and reduction of supply voltage. Reduced transistor current results in deterioration of circuit stability and reduces the speed of circuit operation thereby causing degradation in performance.

In some field effect transistor (FET) devices, the introduction of strain (e.g., compressive or tensile) to a channel region of a FET may be used to improve carrier mobility, which may subsequently increase FET performance. Tensile strain may be used to improve electron mobility, and compressive strain may be used to improve hole mobility. In addition, forming a channel region of a FET with a particular crystallographic orientation may result in increased performance. Specifically, electron mobility may be higher in a <100> crystallographic orientation, while hole mobility may be higher in a <110> crystallographic orientation. However, forming a substrate comprising one or more channel regions with individually tailored strain and crystallographic orientation is challenging.

SUMMARY

According to an embodiment, a method is disclosed. The method may include: forming a crystalline oxide layer on an upper surface of a substrate, the crystalline oxide layer comprising a oxide material having a crystallographic orientation <110>; forming a first silicon on insulator (SOI) layer on an upper surface of the crystalline oxide layer, the first SOI layer comprising a semiconductor material having a crystallographic orientation <100>; and forming a second silicon on insulator (SOI) layer on an upper surface of the crystalline oxide layer adjacent to the first SOI layer, the second SOI layer comprising a semiconductor material having a crystallographic orientation <110>.

According to an embodiment, another method is disclosed. The method may include: forming a crystalline oxide layer on an upper surface of a substrate, the crystalline oxide layer comprising a oxide material having a crystallographic orientation <110>; forming a first silicon on insulator (SOI) layer on an upper surface of the crystalline oxide layer, the first SOI layer comprising a semiconductor material having a crystallographic orientation <100>; removing a portion of the first SOI layer exposing the upper surface of the crystalline oxide layer, the removing a portion of the first SOI layer creating a first remaining portion of the first SOI layer and a second remaining portion of the first SOI layer; forming a shallow trench isolation on the exposed upper surface of the crystalline oxide layer adjacent to a sidewall of the first remaining portion of the first SOI layer and adjacent to a sidewall of the second remaining portion of the first SOI layer; forming a hardmask on an upper surface of the first remaining portion of the first SOI layer; removing the second remaining portion of the first SOI layer exposing the upper surface of the crystalline oxide layer; forming a second silicon on insulator (SOI) layer on the exposed upper surface of the crystalline oxide layer adjacent to a sidewall of the shallow trench isolation, the second SOI layer comprising a semiconductor material having a crystallographic orientation <110>; and removing the hardmask.

According to an embodiment, a structure is disclosed. The structure may include: a crystalline oxide layer on an upper surface of a substrate, the crystalline oxide layer comprising a oxide material having a crystallographic orientation <110>; a first silicon on insulator (SOI) layer on an upper surface of the crystalline oxide layer, the first SOI layer comprising a semiconductor material having a crystallographic orientation <100>; and a second silicon on insulator (SOI) layer on the exposed upper surface of the crystalline oxide layer adjacent to a sidewall of the first SOI layer, the second SOI layer comprising a semiconductor material having a crystallographic orientation <110>.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
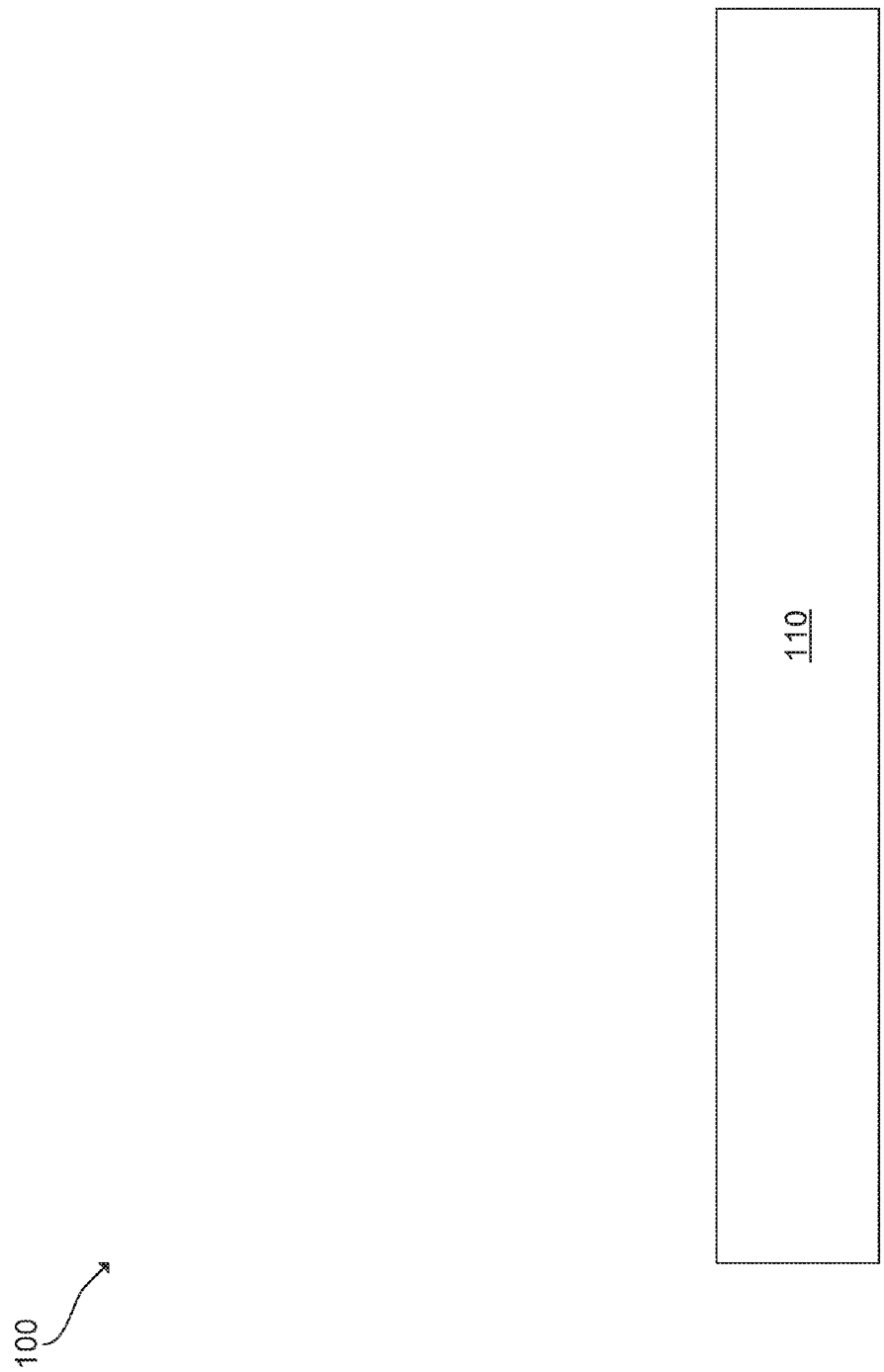
FIG. 1 is a cross section view of a structure, according an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to semiconductor devices, and more particularly, to a structure and method of forming strained <100> n-channel field effect transistor (NFET) fins and adjacent strained <110> p-channel field effect transistor (PFET) fins on the same substrate. Strain engineering is a technique used in semiconductor fabrication to enhance device performance. Carrier mobility may be increased by inducing a strain (e.g. tension or compression) on a channel region of a semiconductor device. A channel with a compressive strain may function well in a PFET device. A channel with a tensile strain may function well in a NFET device. Combining a PFET and NFET in a single device may have significant performance advantages. In addition, carrier mobility may differ through a channel depending on the channel's crystal orientation. Greater electron mobility may be achieved by forming a channel with a (100) surface and a <100> orientation. Greater hole mobility may be achieved by forming a channel with a (110) surface and a <110> orientation. However, forming a substrate comprising one or more channel regions with individually tailored strain and crystallographic orientation is challenging.

Embodiments of the present invention may enable the formation of strained <100> NFET fins and adjacent strained <110> PFET fins on the same substrate. Forming NFET fins with an optimized strain and crystal orientation may increase the performance of the NFET. Forming PFET fins with an optimized strain and crystal orientation may increase the performance of the PFET. By tailoring strain and crystal orientation for both NFET fins and PFET fins on a substrate, embodiments of the present invention may increase device performance. Methods of forming a substrate enabling formation of strained <100> NFET fins and adjacent strained <110> PFET fins on the same substrate is described below with reference to FIGS. 1-10.

Referring now to FIG. 1, a cross section view of a structure 100 is shown. The structure 100 may comprise a substrate 110. The substrate 110 may be composed of any semiconductor material known in the art, including, for example, silicon, germanium, silicon-germanium alloy, silicon carbide, silicon-germanium carbide alloy. In a preferred embodiment, the substrate 110 may be composed of silicon.

In an embodiment, the substrate 110 may have a crystallographic orientation <110>. The crystallographic orientation <110> may include a number of equivalent crystallographic orientations, such as, for example, [110], [011], and [101]. In another embodiment, the substrate 1110 may have a crystallographic orientation <100>. The crystallographic orientation <100> may include a number of equivalent crystallographic orientations, such as, for example, [100], [010], and [001].

Figure 2:
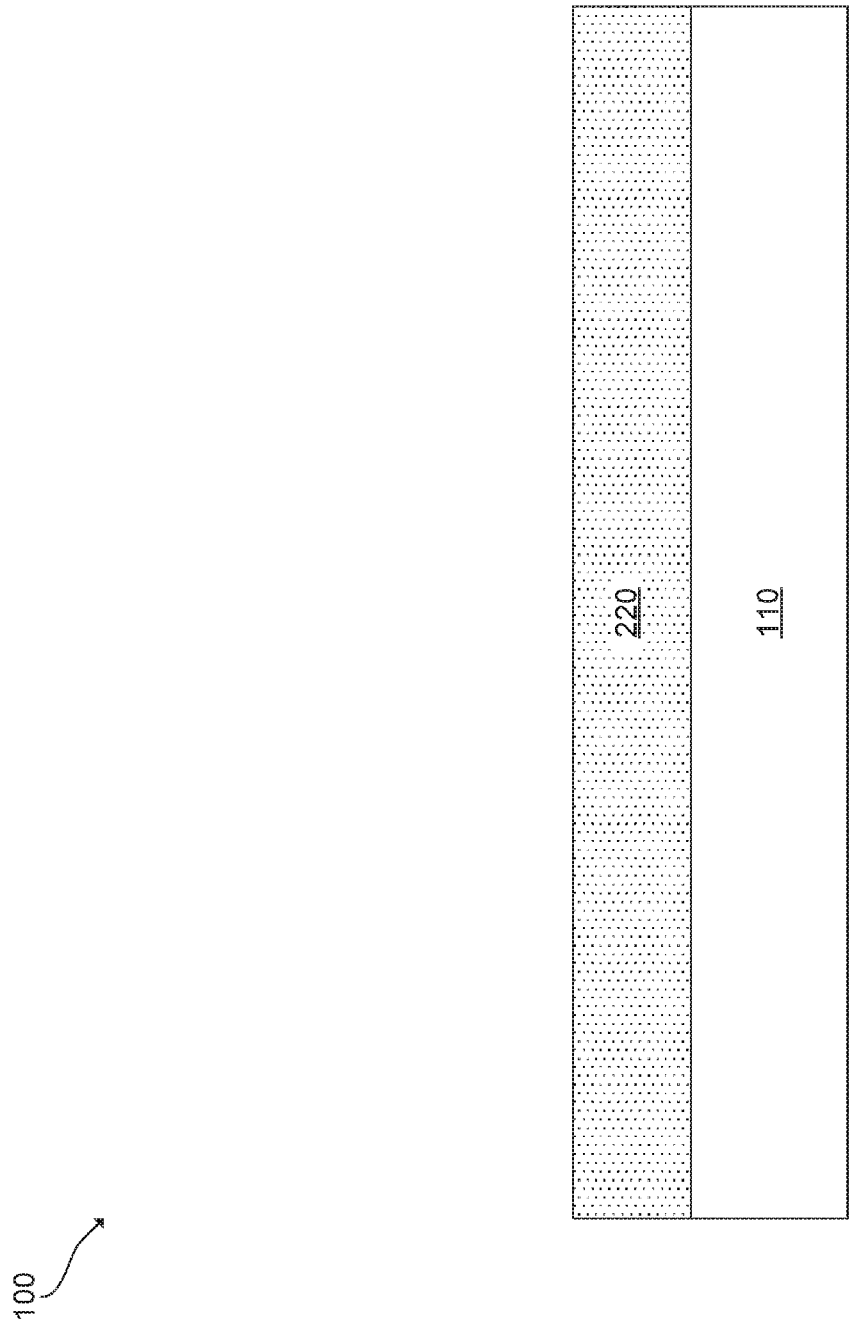
FIG. 2 is a cross section view of forming a crystalline oxide layer, according an embodiment of the present invention.

Referring now to FIG. 2, a cross section view of forming a crystalline oxide layer 220 on the substrate 110 is shown. In a preferred embodiment, the crystalline oxide layer 220 may have a crystallographic orientation <110>. The crystallographic orientation <110> may include a number of equivalent crystallographic orientations, such as, for example, [110], [011], and [101]. Therefore, in an embodiment in which the substrate 100 has a crystallographic orientation <110>, the crystalline oxide layer 220 may be formed using an epitaxial deposition method, such as, for example, molecular beam epitaxy (MBE). In another embodiment, the crystalline oxide layer 220 may be formed using any deposition method known in the art, such as, for example, rapid thermal chemical vapor deposition (RTCVD), low-energy plasma deposition (LEPD), ultra-high vacuum chemical vapor deposition (UHVCVD), and atmospheric pressure chemical vapor deposition (APCVD). As a result of epitaxial deposition on the substrate 110, the crystalline oxide layer 220 may be lattice matched to the substrate 110.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

In an embodiment in which the substrate 110 has a different crystallographic orientation <100> than the crystalline oxide layer 220, the crystalline oxide layer 220 may be formed by wafer bonding and smart cut. In an embodiment, the crystalline oxide layer 220 may be epitaxially grown on a separate wafer, removed from that separate wafer by conventional cutting or planarization techniques, and bonded to the substrate 100 such that the crystalline oxide layer 220 retains its different crystallographic orientation after bonding.

The crystalline oxide layer 220 may be composed of an oxide material, such as, for example, cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$)), or any combination thereof. In some embodiments, the crystalline oxide layer 220 may include combinations of rare earth oxides (e.g., a material such as $ABO_3$, where 'A' and 'B' may be any rare earth metal, such as lanthanum and/or scandium oxide). In yet another embodiment, the crystalline oxide layer 220 may include aluminum oxide $Al_2O_3$ or aluminum oxide compounds, such as lanthanum aluminum oxide ($LaAlO_3$). In yet other embodiments, the crystalline oxide layer 220 may include Perovskites, such as strontium titanate ($SrTiO_3$) or barium titanate ($BaTiO_3$), which may be deposited by pulsed laser deposition (PLD). It is understood that the descriptions of crystalline oxide layers provided herein are for illustrative purposes, and that other crystalline oxide layers or layer combinations may be used in accordance with other embodiments.

Figure 3:
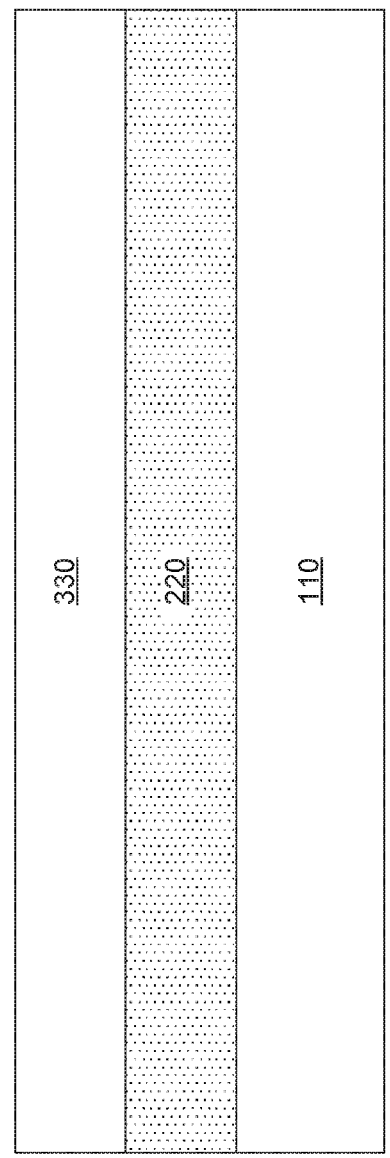
FIG. 3 is a cross section view of forming a first semiconductor on insulator (SOI) layer, according an embodiment of the present invention.

Referring now to FIG. 3, a cross section view of forming a first semiconductor on insulator (SOI) layer 330 on the crystalline oxide layer 220 is shown. In an embodiment, the first SOI layer 330 may be formed on the crystalline oxide layer 220 using wafer bonding and smart cut. In a preferred embodiment, the first SOI layer 330 may be bi-axially strained. In an embodiment, the first SOI layer 330 may be strained on a separate wafer before being bonded onto the crystalline oxide layer 220. The bond may enable retention of the strain in the first SOI layer 330. The first SOI layer 330 may be composed of any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In an embodiment, the first SOI layer 330 may have a crystallographic orientation <100> that may include a number of equivalent crystallographic orientations, such as, for example, [100], [010], and [001].

In a preferred embodiment, the first SOI layer 330 may be composed of bi-axially strained silicon with the crystallographic orientation <100>. In another embodiment, the first SOI layer 330 may be composed of unstrained silicon with a crystallographic orientation <100>. In another embodiment, the first SOI layer 330 may include a strained portion and an unstrained portion. Using silicon with a crystallographic orientation <100> for a channel in a FET device may enable high electron mobility, and thus, be well-suited for high power devices. High power devices may operate at high speed but may consume more power than low power devices. A channel comprised of unstrained silicon may be suited for low power devices, such as, for example, auxiliary devices. Low power devices may consume less power, and thus, enable a longer battery life for battery dependent devices.

Figure 4:
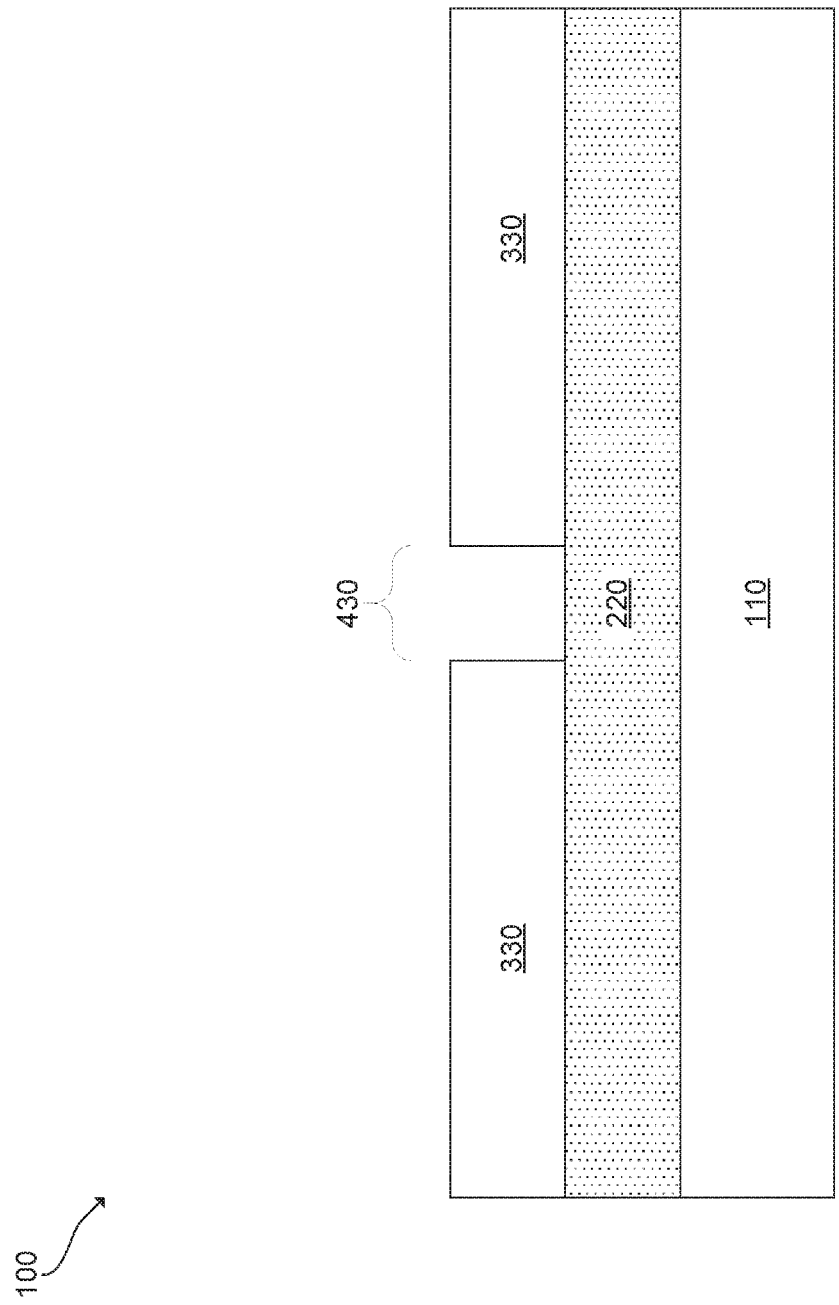
FIG. 4 is a cross section view of removing a portion of the first SOI layer, according an embodiment of the present invention.

Referring now to FIG. 4, a cross section view of removing a portion of the first SOI layer 330 to form an opening 430 is shown. The opening 430 may expose an upper surface of the crystalline oxide layer 220. The opening 430 may be formed using a conventional etching process, such as, for example, reactive-ion etching (RIE).

Figure 5:
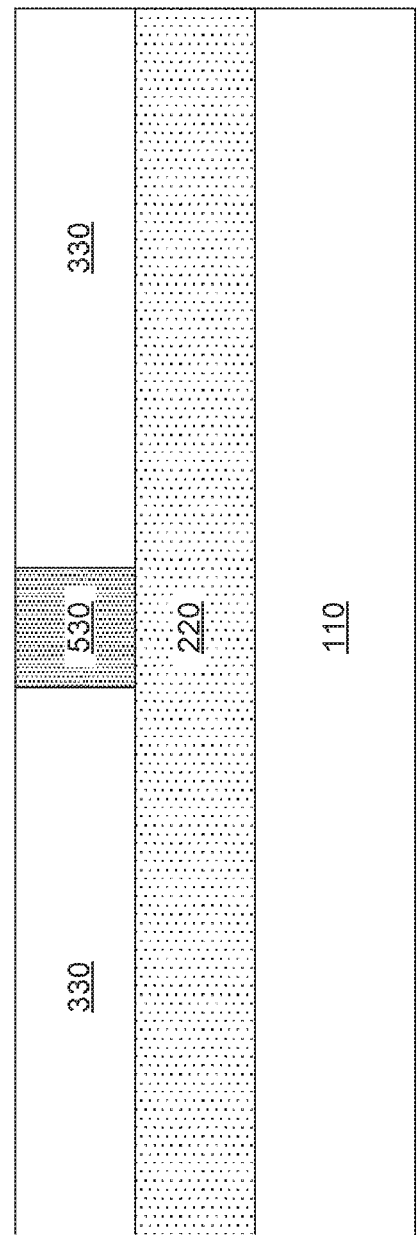
FIG. 5 is a cross section view of forming a shallow trench isolation (STI) layer, according an embodiment of the present invention.

Referring now to FIG. 5, a cross section view of forming a shallow trench isolation (STI) layer 530 in the opening 403 (FIG. 4) is shown. The STI layer 530 may be formed using any suitable deposition technique known the art, including, for example, CVD, PVD, MBE, ALD, PLD, LSMCD, sputtering, or platting. The STI layer 530 may be composed a dielectric material, such as, for example, silicon nitride, silicon oxide, silicon oxynitride, SiBCN, SiOCN, or a combination thereof.

Figure 6:
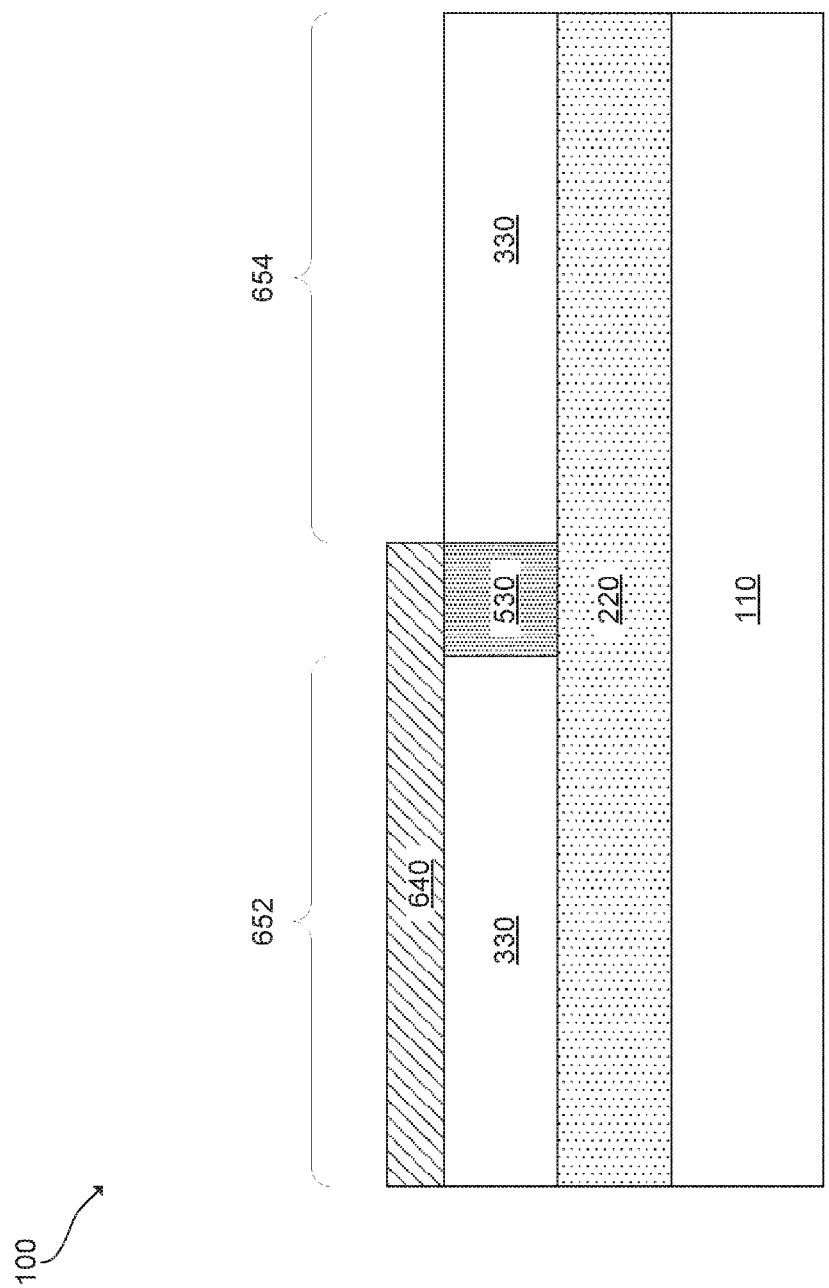
FIG. 6 is a cross section view of forming a hardmask, according an embodiment of the present invention.

Referring now to FIG. 6, a cross section view of forming a hardmask 640 on a portion of the first SOI layer 330 and the STI layer 530 is shown. The hardmask 640 may protect one or more <100> active regions 652 (hereinafter "<100> active regions") adjacent to the STI layer 530 from subsequent fabrication processes. One or more <110> active regions 654 (hereinafter "<110> active regions") adjacent to the STI layer 530 may remain exposed. In an embodiment, the hardmask 640 may be formed over the entire upper surface of the STI layer 530. In another embodiment, the hardmask 640 may be formed over only a portion of the STI layer 530. The hardmask 640 may be formed using any suitable deposition technique known the art, including, for example, ALD, CVD, PVD, MBD, PLD, LSMCD, sputtering, or platting. The hardmask 640 may be composed of a dielectric material, such as, for example, silicon nitride, silicon oxide, silicon oxynitride, SiBCN, SiOCN, or a combination thereof. In a preferred embodiment, the hardmask 640 may be composed of silicon nitride.

Figure 7:
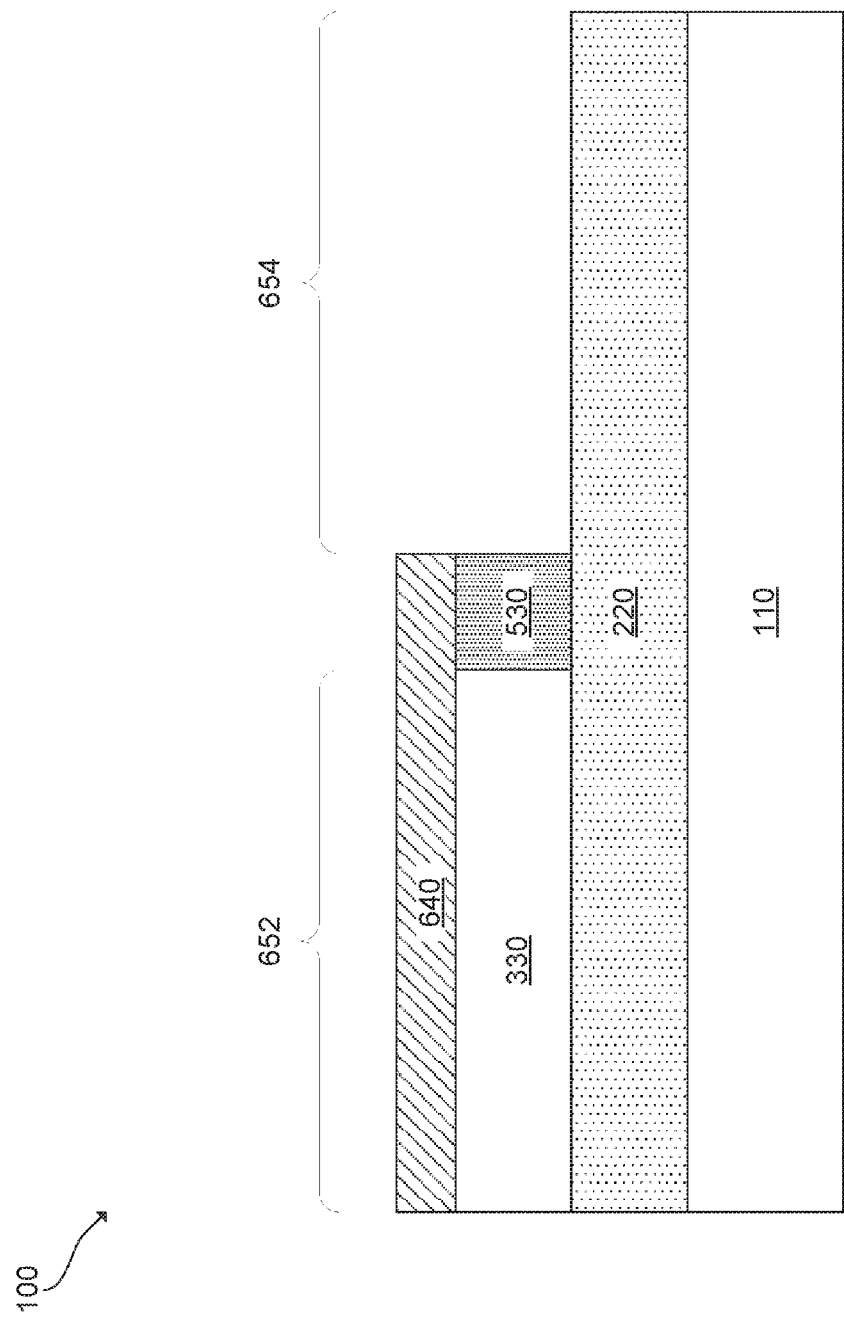
FIG. 7 is a cross section view of removing an exposed portion of the first SOI layer, according an embodiment of the present invention.

Referring now to FIG. 7, a cross section view of removing the exposed portion of the first SOI layer 330 is shown. The exposed portion of the first SOI layer 330 may be within the <110> active regions 654. The exposed portion of the first SOI layer 330 may be removed using a conventional etching process, such as, for example, RIE. Removing the exposed portion of the first SOI layer 330 may expose the upper surface of the crystalline oxide layer 220 in the <100> active regions 654.

Figure 8:
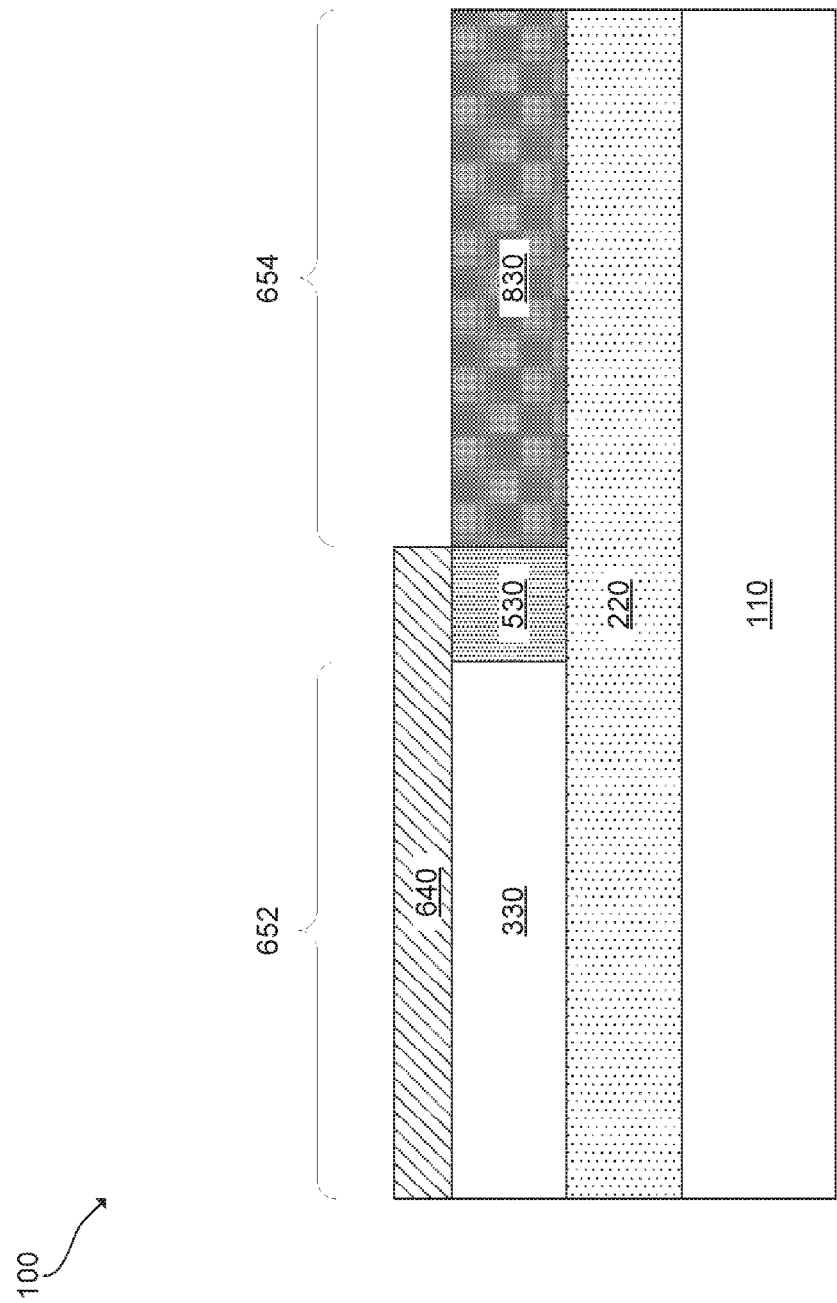
FIG. 8 is a cross section view of forming a second SOI layer, according an embodiment of the present invention.

Referring now to FIG. 8, a cross section view of forming a second semiconductor on insulator (SOI) layer 830 is shown. In an embodiment, the second SOI layer 830 may be formed using an epitaxial deposition method, such as, for example, RTCVD, UHVCVD, APCVD, MBE and LEPD. As a result of the epitaxial deposition on the crystalline oxide layer 220, the second SOI layer 830 may be lattice matched to the crystalline oxide layer 220. In an embodiment, the second SOI layer 830 may have a crystallographic orientation <110>. The crystallographic orientation <110> may include a number of equivalent crystallographic orientations, such as, for example, [110], [011], and [101]. The second SOI layer 830 may be composed of any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide.

In a preferred embodiment, the second SOI layer 830 may be composed of strained silicon germanium with the crystallographic orientation <110>. Using silicon germanium with a crystallographic orientation <110> for a channel of a FET device may enable high hole mobility, and thus, be well-suited for high power devices. High power devices may operate at high speed but may also consume more power than low power devices.

Figure 9:
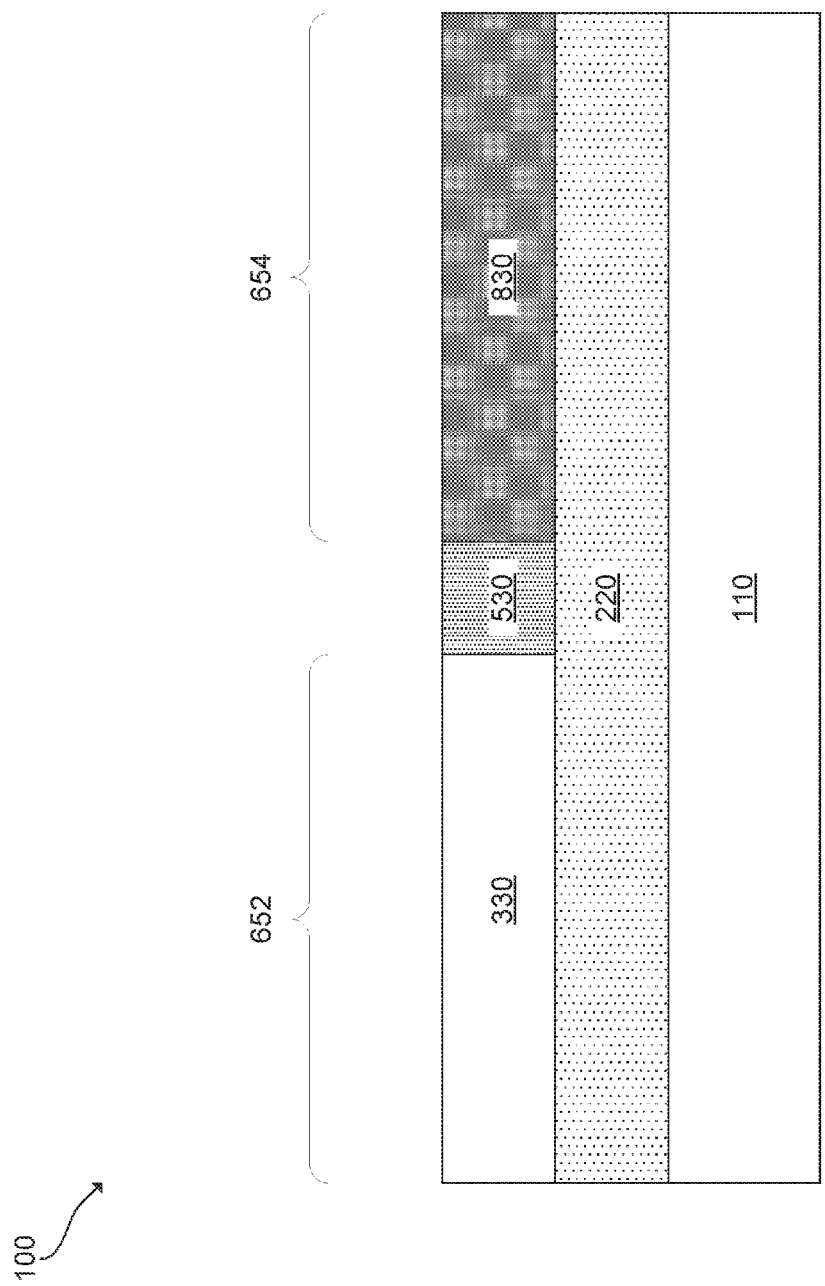
FIG. 9 is a cross section view of removing the hardmask, according an embodiment of the present invention.

Referring now to FIG. 9, a cross section view of removing the hardmask 640 (FIG. 8) is shown. In an embodiment, the hardmask 640 may be removed using a conventional etching process, such as, for example, RIE, a hot phosphoric acid etch, a selective wet etch, or a combination of conventional etching processes. In an embodiment, the hardmask 640 may be removed using a conventional planarization process, such as, for example, CMP.

Figure 10:
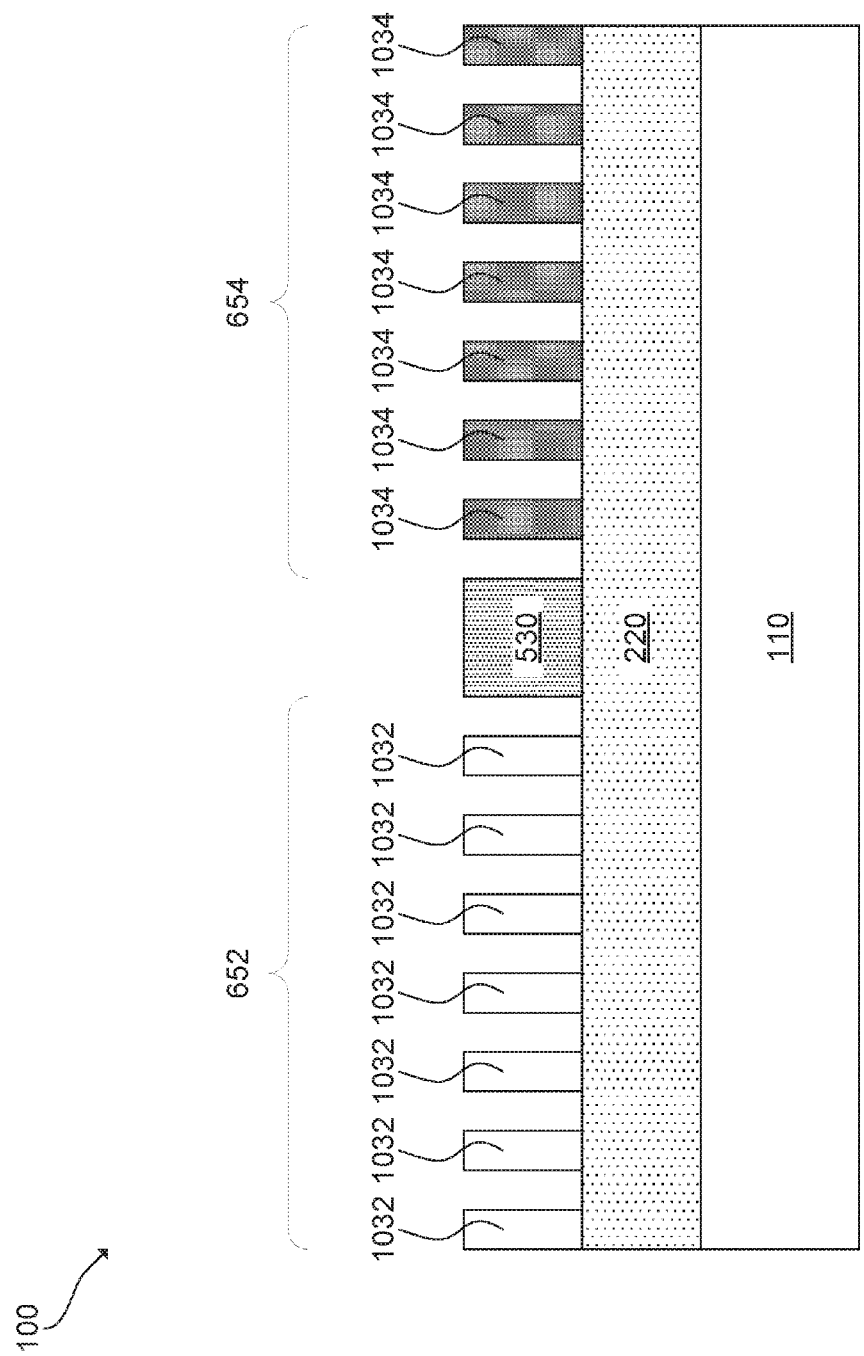
FIG. 10 is a cross section view of forming one or more <100> fins and one or more <110> fins, according an embodiment of the present invention.

Referring now to FIG. 10, a cross section view of forming one or more <100> fins 1032 (hereinafter "<100> fins") and one or more <110> fins 1034 (hereinafter "<110> fins") is shown. The <100> fins 1032 may be formed by removing a portion of the first SOI layer 330 (FIG. 9) using a conventional material removal process, such as, for example, sidewall image transfer (SIT). The <100> fins 1032 may be located in the <100> active regions 652. In an embodiment, the <100> fins 1032 may be used as a channel in one or more NFET devices. Accordingly, the <110> fins 1034 may be formed by removing a portion of the second SOI layer 830 (FIG. 9) using a conventional material removal process, such as, for example, sidewall image transfer (SIT). The <110> fins 1034 may be located in the <110> active regions 654. In an embodiment, the <110> fins 1034 may be used as a channel in one or more PFET devices.

Embodiments of the present invention may form a substrate which enables formation of a strained <100> NFET and an adjacent strained <110> PFET on the same substrate. Embodiments of the present invention may also form an unstrained <100> substrate which may be used for low power devices (e.g. auxiliary devices). By independently tailoring strain and crystallographic orientation for NFET and PFET devices on a substrate, embodiments of the present invention may support high carrier mobility, and thus, increased performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a crystalline oxide layer directly on an upper surface of a substrate, the crystalline oxide layer comprising a oxide material having a crystallographic orientation <110>;
   forming a first silicon on insulator (SOI) layer on an upper surface of the crystalline oxide layer, the first SOI layer comprising a semiconductor material having a crystallographic orientation <100>;
   removing a portion of the first SOI layer to form an opening, the opening exposing the upper surface of the crystalline oxide layer and creating a first remaining portion of the first SOI layer and a second remaining portion of the first SOI layer;
   forming a hardmask on an upper surface of the first remaining portion of the first SOI layer;
   removing the second remaining portion of the first SOI layer exposing the upper surface of the crystalline oxide layer;
   forming a second silicon on insulator (SOI) layer directly on an upper surface of the crystalline oxide layer adjacent to the first SOI layer, the second SOI layer comprising a semiconductor material having a crystallographic orientation <110>;
   removing the hardmask;
   forming <100> fins in the first SOI layer; and
   forming <110> fins in the second SOI layer.

2. The method of claim 1, wherein the forming the crystalline oxide layer on the substrate comprises epitaxially growing the crystalline oxide layer on the substrate.

3. The method of claim 1, wherein the forming the crystalline oxide layer on the substrate comprises wafer bonding and splitting.

4. The method of claim 1, wherein the forming the first SOI layer on the crystalline oxide layer comprises wafer bonding and splitting.

5. The method of claim 1, wherein the forming the second SOI layer on the crystalline oxide layer comprises epitaxially growing the second SOI layer on the crystalline oxide layer.

6. The method of claim 1, wherein the first SOI layer comprises strained silicon.

7. The method of claim 1, wherein the second SOI layer comprises strained silicon germanium.

8. The method of claim 1, wherein the substrate comprises silicon having a crystallographic orientation <100>.

9. The method of claim 1, wherein the substrate comprises silicon having a crystallographic orientation <110>.

10. A structure comprising:
    a crystalline oxide layer on an upper surface of a substrate, the crystalline oxide layer comprising a oxide material having a crystallographic orientation <110>;
    <100> fins directly on an upper surface of the crystalline oxide layer, the <100> fins comprising a first silicon on insulator (SOI) layer made of a semiconductor material having a crystallographic orientation <100>;
    a shallow trench isolation (STI) layer on the upper surface of the crystalline oxide layer adjacent to the <100> fins; and
    <110> fins directly on the upper surface of the crystalline oxide layer adjacent to the STI layer, the <110> fins comprising a second silicon on insulator (SOI) layer made of a semiconductor material having a crystallographic orientation <110>.

11. The structure of claim 10, wherein the first SOI layer comprises tensile strained silicon.

12. The structure of claim 10, wherein the second SOI layer comprises a compressive strained silicon germanium.

* * * * *